(12) United States Patent
Lee

(10) Patent No.: US 6,873,178 B2
(45) Date of Patent: Mar. 29, 2005

(54) SKEWED BUS DRIVING METHOD AND CIRCUIT

(75) Inventor: Hoi-Jin Lee, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 81 days.

(21) Appl. No.: 10/353,595

(22) Filed: Jan. 29, 2003

(65) Prior Publication Data

US 2003/0227296 A1 Dec. 11, 2003

(30) Foreign Application Priority Data

Jun. 7, 2002 (KR) .............................. 10-2002-0032012

(51) Int. Cl.$^7$ .............................................. H03K 17/16
(52) U.S. Cl. .............................. 326/21; 326/22; 326/26; 326/82
(58) Field of Search .............................. 326/21, 22, 26, 326/82, 86, 90

(56) References Cited

U.S. PATENT DOCUMENTS 5,473,570 A   12/1995  Sato et al. .................. 365/221
6,590,421 B2 * 7/2003  Chung et al. ................. 326/83
6,703,868 B2 * 3/2004  Savaria et al. .............. 326/101

FOREIGN PATENT DOCUMENTS

JP          07-045087          2/1995

* cited by examiner

*Primary Examiner*—Anh Q. Tran
(74) *Attorney, Agent, or Firm*—F. Chau & Associates LLC; Frank V. DeRosa

(57) ABSTRACT

Circuits and methods for driving buses (data buses or address buses) which provide a reduction in interference such as crosstalk between adjacent bus lines of a bus, even as the width of the bus increases and the intervals between the bus lines decrease. In the bus driving circuits and methods, a portion of the bus lines are driven at a first time, and a portion of the bus lines are driven at a second time, subsequent to the first time, so as to reduce or eliminate crosstalk between adjacent bus lines.

16 Claims, 6 Drawing Sheets

SKEWED BUS DRIVING METHOD AND CIRCUIT

CROSS-REFERENCE TO RELATED APPLICATION

This application claims priority to Korean Patent Application No. 2002-32012, filed Jun. 7, 2002, the disclosure of which is fully incorporated herein by reference.

TECHNICAL FIELD OF THE INVENTION

The present invention relates to semiconductor integrated circuits (IC), and more particularly, to methods and circuits for driving a plurality of buses in a semiconductor integrated circuit to reduce or eliminate cross-coupling between the buses.

BACKGROUND

In recent years, bandwidths for data communication systems have continuously increased to provide improved system performance. Indeed, the bandwidths of address and data busses can be 128 bits or more. With the increase in the bandwidths of address and data busses, however, interference such as crosstalk has become a serious problem.

In a semiconductor IC, bus lines of a bus (e.g., data bus, address bus) are arranged in an order from a least significant bit (LSB) to a most significant bit (MSB), and intervals (spacing) between the bus lines are preferably set to prevent interference such as crosstalk. Since the interference increases proportionally to the increase in the width of a bus, the interval between the bus lines should be increased to prevent crosstalk interference. However, an increase in the intervals results in an increase in the chip area of the semiconductor IC, which is undesirable. Therefore, there is a strong need for a methods and circuits for driving data and address busses, which are capable of reducing interference such as crosstalk, even when the width of a bus increases.

FIG. 1 is a timing diagram illustrating a conventional bus driving method and FIG. 2 illustrates a conventional driving circuit which can be used for implementing the method of FIG. 1. For convenience of explanation, FIGS. 1 and 2 illustrate a conventional bus driving method and circuit for an 8-bit data bus.

Referring to FIGS. 1 and 2, in response to activation of an enable signal (EN), drivers 21–23 receive data D0—D7 and simultaneously drive data buses (DATA[7:0]). Assuming the intervals among data buses in the semiconductor IC chip are narrow and DATA[7:0] is '01000101', victim DATA6 is exposed to a −4C coupling effect (i.e., a type of interference) by aggressors DATA7 and DATA5 such that the logic value "1" of DATA6 may drop below an output high voltage (Voh). Further, when exposed to a +4C coupling effect by aggressors DATA2 and DATA0, the logic value "0" of the victim DATA1 may rise above an output low voltage (Vol). In these cases, the operation speed of the semiconductor IC may decrease or erroneous operations may occur.

More specifically, the term "coupling" means that transition of DATA[i] affects DATA[i+1], wherein DATA[i] which produces the effect is referred to as an "aggressor", and wherein DATA[i+1] which is affected is referred to as a "victim." Capacitance between the aggressor and the victim is referred to as coupling capacitance (C).

As described above, with the conventional bus driving method and circuit, bus lines of the bus are simultaneously driven such that when the width of the bus increases, interference may result, which can cause the loss of operating speed of the semiconductor IC and/or cause erroneous operations to occur.

SUMMARY OF THE INVENTION

The present invention is directed to circuits and methods for driving buses (data buses or address buses), which provide a reduction in interference such as crosstalk between adjacent bus lines of a bus, even as the width of the bus increases and the intervals between the bus lines decrease. In general, bus driving circuits and methods according to the invention reduce interference by driving a portion of the bus lines of a bus at a first time, and driving a portion of the bus lines of the bus at a second time, which is subsequent to the first time, so as to reduce or eliminate crosstalk between adjacent bus lines.

In one aspect of the invention, a method for driving a bus (having a plurality of bus lines) comprises the steps of driving at a first time, each bus line that is to transmit a data bit having a first logic value, and driving at a second time which is subsequent to the first time, each bus line that is to transmit a data bit having a second logic value. The second time can be either a predetermined delay time or a time after the transition slopes of the buses, which are driven at the second time, are lowered.

In another aspect of the invention, a method for driving a bus (having a plurality of bus lines) comprises the steps of driving a first set of alternating bus lines of the bus at a first time, and driving a second set of alternating bus lines of the bus at a second time, which is subsequent to the first time. The second time can be either a predetermined delay time or a time after the transition slopes of the second set of bus lines are lowered. In one embodiment, the first set of alternating bus lines comprise odd-numbered bus lines and the second set of alternating bus lines comprise even-numbered bus lines. In another embodiment, the first set of alternating bus lines comprise even-numbered bus lines and the second set of alternating bus lines comprise odd-numbered bus lines.

In yet another aspect of the invention, a method for driving a bus (having a plurality of bus lines) comprises the steps of determining whether a group of data bits loaded on three sequentially adjacent bus lines are [0, 1, 0]. If the data bits are not [0, 1, 0], the three sequentially adjacent bus lines are driven simultaneously without delay. If the data bits are [0, 1, 0], the bus lines corresponding to the two most significant bits of the group of data bits are driven at a first time, and the bus line corresponding to the least significant data bit of the group of data bits is driven at a second time, which is subsequent to the first time. The second time can be either a predetermined delay time or a time after the transition slope of the bus corresponding to the least significant bit is lowered.

In another aspect of the invention, a circuit for driving a bus (having a plurality of bus lines) comprises a plurality of control circuits, wherein each control circuit is associated with a bus line and wherein each control circuit outputs a control signal comprising one of a driver enable signal and a delayed driver enable signal, based on a logic level of a data bit to be loaded on an associated bus line. The circuit further comprises a plurality of drivers, wherein each driver is associated with a bus line and corresponding control circuit, and wherein each driver is responsive to the control signal output from a corresponding control circuit to drive an associated bus line. Preferably, each control circuit comprises a delay element which delays the driver enable signal for a predetermined time, and a selector that (i) selects and outputs the driver enable signal, if a data bit to be loaded on the associated bus line has a first logic value and that (ii) selects and outputs the delayed driver enable signal, if a data bit to be loaded on the associated bus line has a second logic value.

In yet another aspect of the invention, a circuit for driving a bus (having a plurality of bus lines) comprises a delay element for delaying a driver enable signal for a predetermined time, and a plurality of drivers, wherein each driver drives an associated bus line, wherein drivers associated with a first set of alternating bus lines receive the driver enable signal to drive the first set of alternating bus lines at a first time, and wherein drivers associated with a second set of alternating bus lines receive a delayed driver enable signal output from the delay element to drive the second set of alternating bus lines at a second time which is subsequent to the first time. In one embodiment, the first set of alternating bus lines comprise odd-numbered bus lines and the second set of alternating bus lines comprise even-numbered bus lines. In another embodiment, the first set of alternating bus lines comprise even-numbered bus lines and the second set of alternating bus lines comprise odd-numbered bus lines.

In another aspect of the invention, a circuit for driving a bus (having a plurality of bus lines) comprises a plurality of control circuits, wherein each control circuit outputs a driver enable signal without delay, if data bits loaded on three sequentially adjacent bus lines are not [0, 1, 0], and wherein each control circuit delays the driver enable signal for a predetermined time and then outputs a delayed driver enable signal, if the data bits loaded on the three sequentially adjacent bus lines are [0, 1, 0]. The circuit further comprises a plurality of drivers which drive corresponding bus lines in response to the output signals from the control circuits. Preferably, each control circuit comprises a logic circuit that deactivates a control signal if the data bits are not [0, 1, 0], and activates the control signal if the data bits are [0, 1, 0,], a delay element which delays the driver enable signal for the predetermined time, and a selector that selects and outputs the driver enable signal if the control signal is not activated, and selects and outputs the delayed driver enable signal if the control signal is activated.

These and other aspects, embodiments features and advantages of the invention will be described or become more apparent from the following detailed description of preferred embodiments, which is to be read in connection with the accompanying drawings.

DETAILED DESCRIPTION OF PREFERRED EMBODIMENTS

Figure 1:
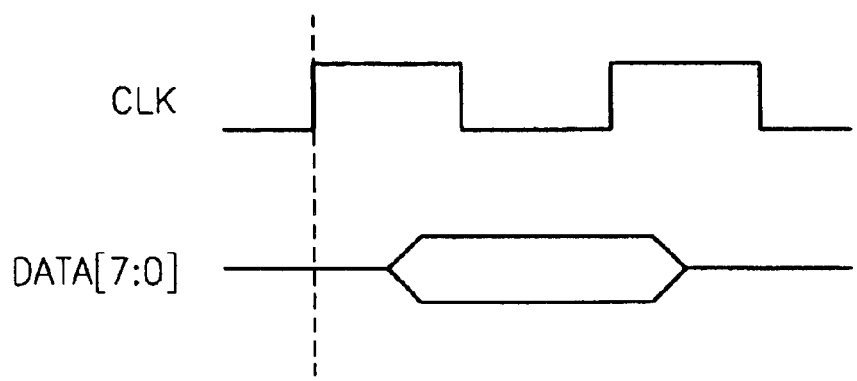
FIG. 1 is a timing diagram showing a bus driving method according to the prior art.
Figure 2:
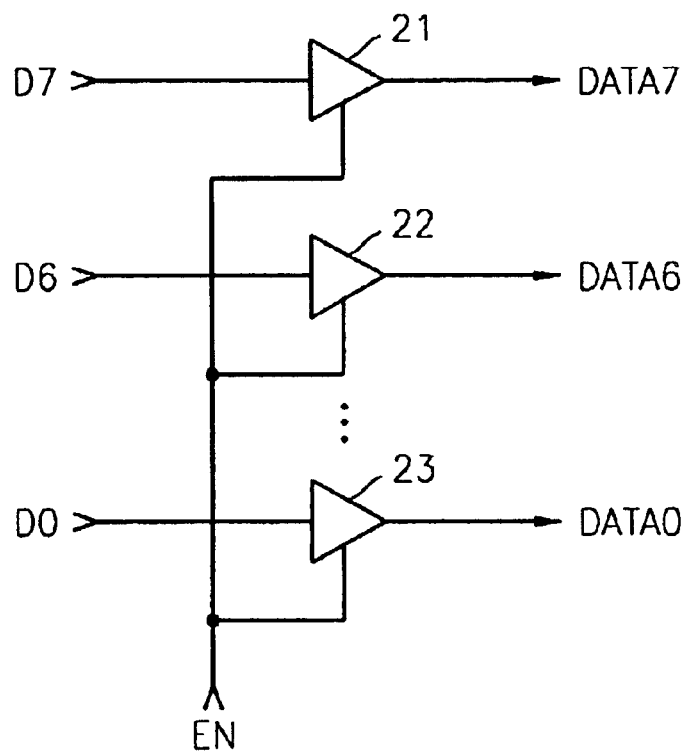
FIG. 2 is a diagram showing a bus driving circuit according to the prior art.
Figure 3:
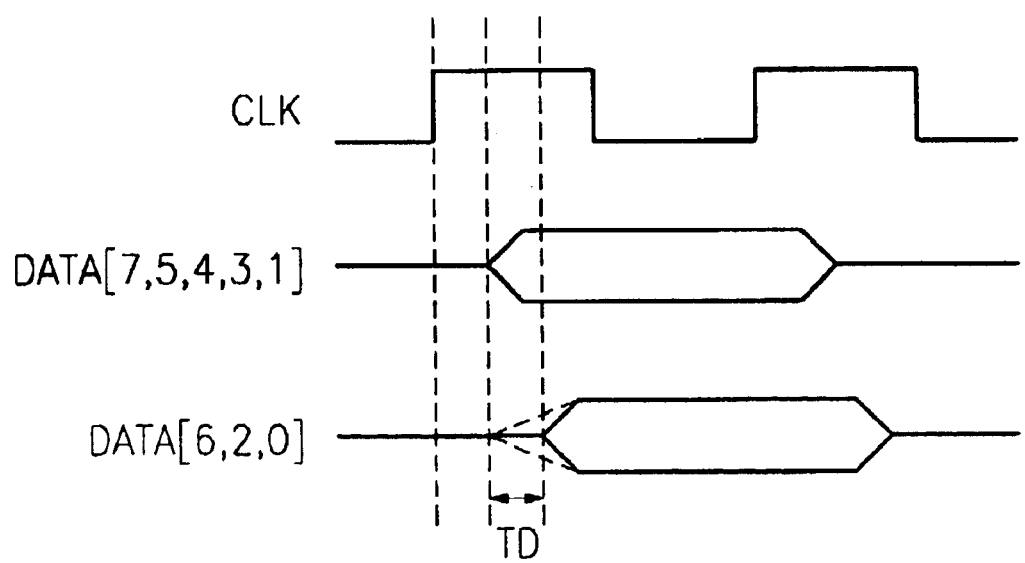
FIG. 3 is a timing diagram showing a bus driving method according to an embodiment of the present invention.
Figure 4:
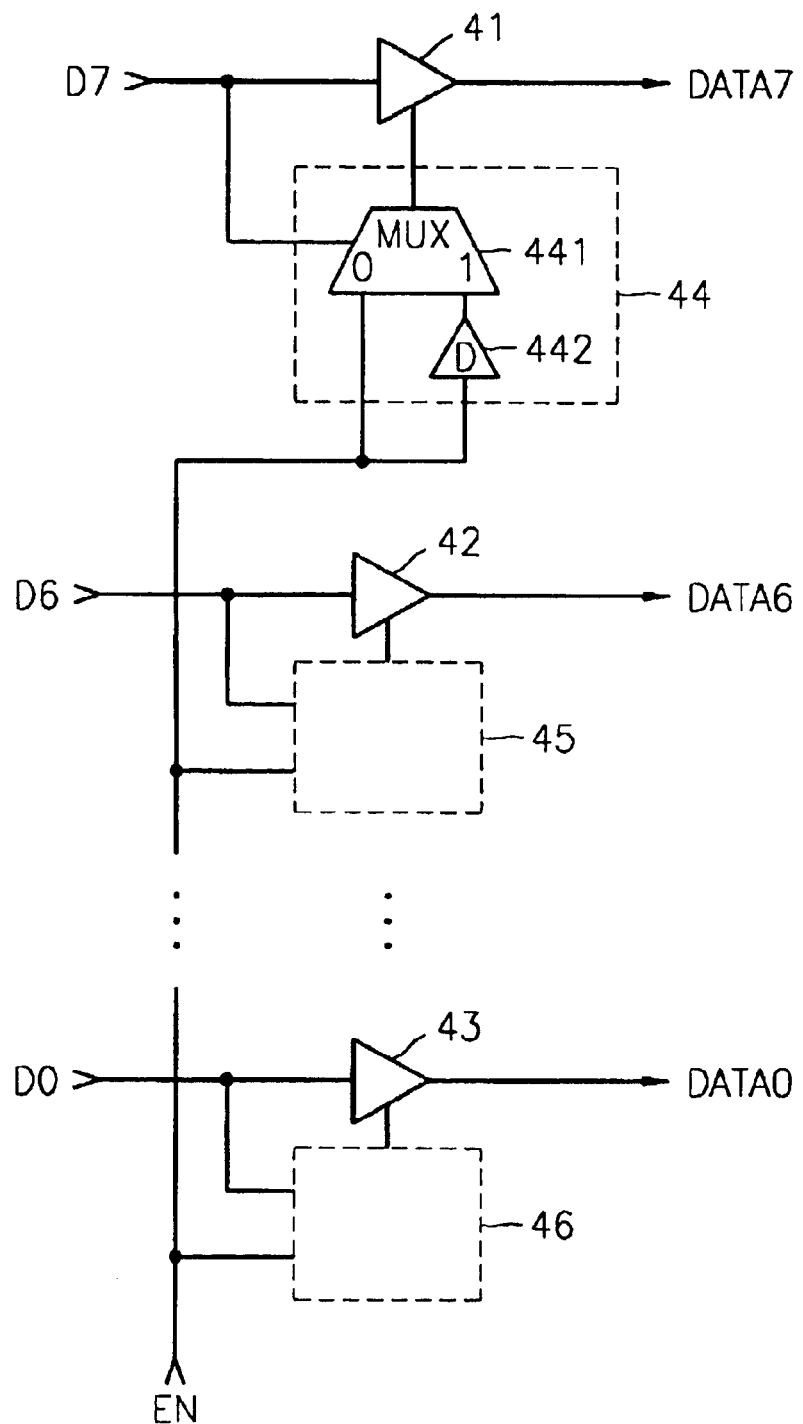
FIG. 4 is a circuit diagram showing a bus driving circuit according to an embodiment of the present invention.

FIG. 3 is a timing diagram showing a bus driving method according to an embodiment of the present invention. FIG. 4 is a circuit diagram showing a bus driving circuit according to an embodiment of the present invention, which is preferably used for implementing the method of FIG. 3. For illustrative purposes, a method and circuit according to this embodiment will be explained with reference to an 8-bit data bus, although it is to be understood that the invention may be used with other size data busses or address busses.

The timing diagram of FIG. 3 illustrates a bus driving method according to an embodiment of the invention, wherein data bus lines of a data bus on which a data bit is to be loaded having a first logic value, for example, logic "0", are driven first, and then data bus lines of the data bus on which a data bit is to be loaded having second logic value, for example, logic "1", are subsequently driven with a time difference. The time difference may be, e.g., a predetermined delay time (TD), or a time after the transition slopes (dotted lines) of the buses are lowered.

For example, assume a byte of data to be loaded on data buses (DATA[7:0]) is '01000101', the data buses (DATA[7, 5, 4, 3, 1]) on which a data bit of logic "0" is loaded, are first driven. Then, the data buses (DATA[6, 2, 0]) on which a data bit of logic "1" is loaded, are driven with a time difference, that is, after a predetermined time delay (TD) or after the transition slopes of the buses are lowered. In this example, victim DATA6 becomes an aggressor such that DATA6 does not overlap the transitions of victims DATA7 and DATA5, while victim DATA1 does not overlap the transitions of aggressors DATA2 and DATA0. Accordingly, this driving method reduces the effect of coupling.

In particular, in the example above, the coupling effect of the aggressor DATA6 on both of the victims DATA7 and DATA5 is +C, and the coupling effect of both of the aggressors DATA2 and DATA0 on the victim DATA1 is +2C. C is coupling capacitance between an aggressor and a victim.

FIG. 4 is a diagram of a bus driving circuit according to an embodiment of the invention, which is preferably used to implement the driving method described above with reference to FIG. 3. The bus driving circuit comprises control circuits 44, 45 . . . 46 and drivers 41, 42 . . . 43. In response to data (D[7:0]) that is to be loaded on data bus (DATA [7:0]), each control circuit 44, 45 . . . 46 for the corresponding data bus line outputs an enable signal (EN) either without delay or after a predetermined time (TD). In response to control signals output from control circuits 44, 45 . . . 46, corresponding drivers 41, 42 . . . 43 drive data buses (DATA[7:0]).

Each of the control circuits 44, 45 . . . 46 comprises a delay element 442 and a selector 441. The delay 442 delays an enable signal (EN) for a predetermined time (TD). The selector 441 is preferably a multiplexer. In one exemplary embodiment, if a data bit to be loaded on a given data bus line has a first logic value, for example, logic "0", the selector 441 selects and outputs an enable signal (EN) and if a data bit to be loaded on a data bus line has a second logic value, for example, logic "1", the selector 441 selects and outputs the output signal of the delay 442. Accordingly, among the drivers 41, 42 . . . 43, drivers that receive logic "0" are first enabled, and after a predetermined time (TD), drivers that receive logic "1" are enabled. Therefore, data bus lines on which logic "0" is to be loaded are driven first, and after a predetermined time (TD), data bus lines on which logic "1" is to be loaded are subsequently driven.

Figure 5:
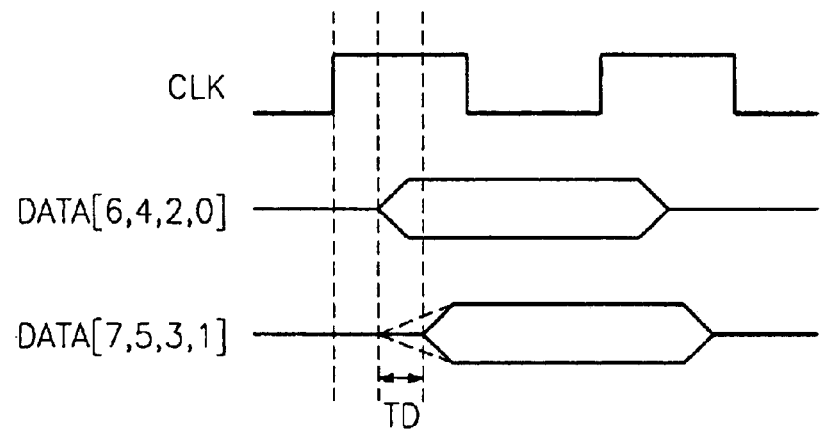
FIG. 5 is a timing diagram showing a bus driving method according to another embodiment of the present invention.
Figure 6:
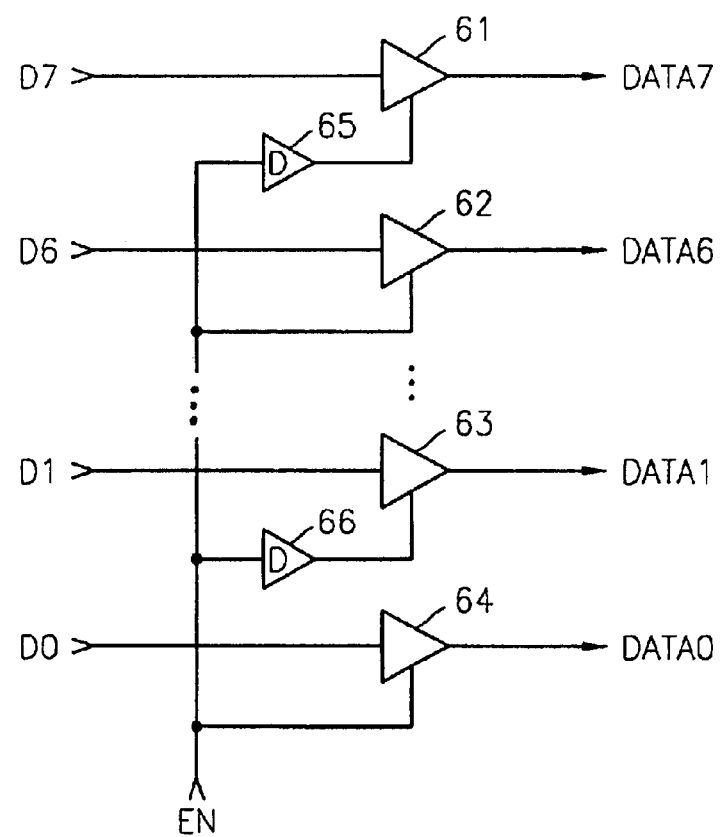
FIG. 6 is a circuit diagram showing a bus driving circuit according to another embodiment of the present invention.

FIG. 5 is a timing diagram showing a bus driving method according to another embodiment of the present invention. FIG. 6 is a circuit diagram showing a bus driving circuit according to another embodiment of the invention, which is preferably used for implementing the method of FIG. 5. For illustrative purposes, a method and circuit according to this embodiment will be explained with reference to an 8-bit data bus, although it is to be understood that the invention may be used with other size data busses or address busses.

The timing diagram of FIG. 5 illustrates a bus driving method according to an embodiment of the invention wherein, regardless of logic level of the data bits to be loaded on data buses (DATA[7:0]), even-numbered data buses (DATA[6, 4, 2, 0]) are driven first, and then odd-numbered data buses (DATA[7, 5, 3, 1]) are driven with a time difference, that is, after a predetermined time delay (TD), or after the transition slopes of the buses (dotted lines) are lowered. In this embodiment, although there may be some coupling, the effect of coupling is significantly reduced (by half) as compared to the conventional bus driving method.

FIG. 6 illustrates a bus driving circuit according to an embodiment of the invention, which is preferably used to implement the method described above with reference to FIG. 5. The bus driving circuit comprises delays 65, 66 that delay an enable signal (EN) for a predetermined time (TD), drivers (e.g., 62 and 64) that first drive even-numbered data buses (DATA[6, 4, 2, 0]) in response to an enable signal (EN), and drivers (e.g., 61 and 63) that drive odd-numbered data buses (DATA[7, 5, 3, 1]) in-response to an enable signal (EN) which is delayed for a predetermined time through the delays 65, 66.

Thus, since the drivers 62 and 64 are first enabled, and the drivers 61 and 63 are enabled after a predetermined time (TD), even-numbered data buses (DATA[6, 4, 2, 0]) are driven first and the odd-numbered data buses (DATA[7, 5, 3, 1]) are driven after a predetermined delay time (TD).

It is to be understood that although the embodiments of FIGS. 5 and 6 have been described such that even-numbered data buses (DATA[6, 4, 2, 0]) are driven first and odd-numbered data buses (DATA[7, 5, 3, 1]) are subsequently driven, the present invention may also be embodied as the inverse of such case, wherein odd-numbered data buses (DATA[7, 5, 3, 1]) are driven first and the even-numbered data buses (DATA[6, 4, 2, 0]) are subsequently driven after a predetermined delay time (TD). In either embodiment, the resulting improvement is the same.

Figure 7:
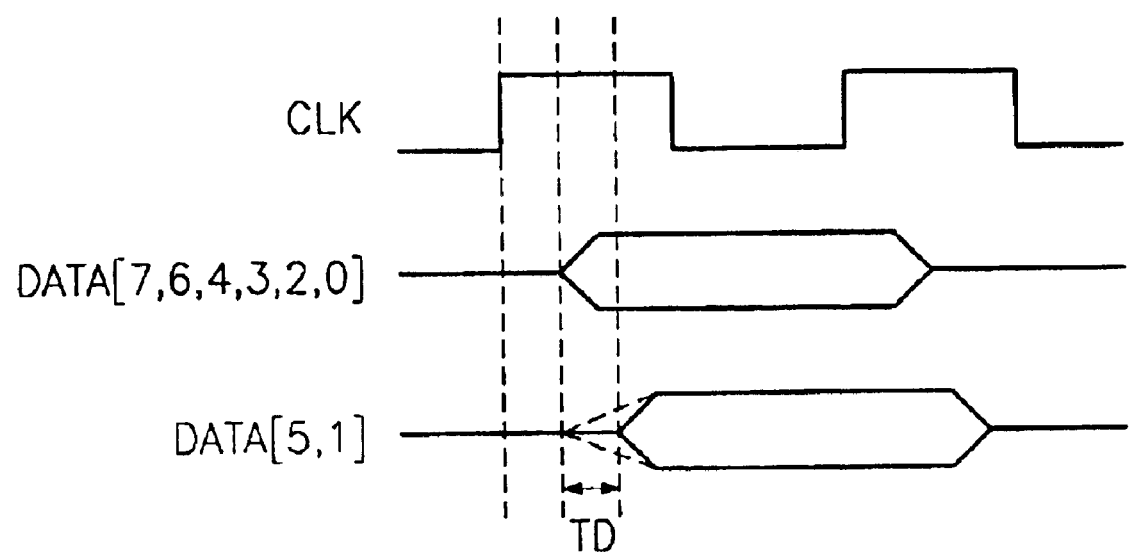
FIG. 7 is a timing diagram showing a bus driving method according to another embodiment of the present invention.
Figure 8:
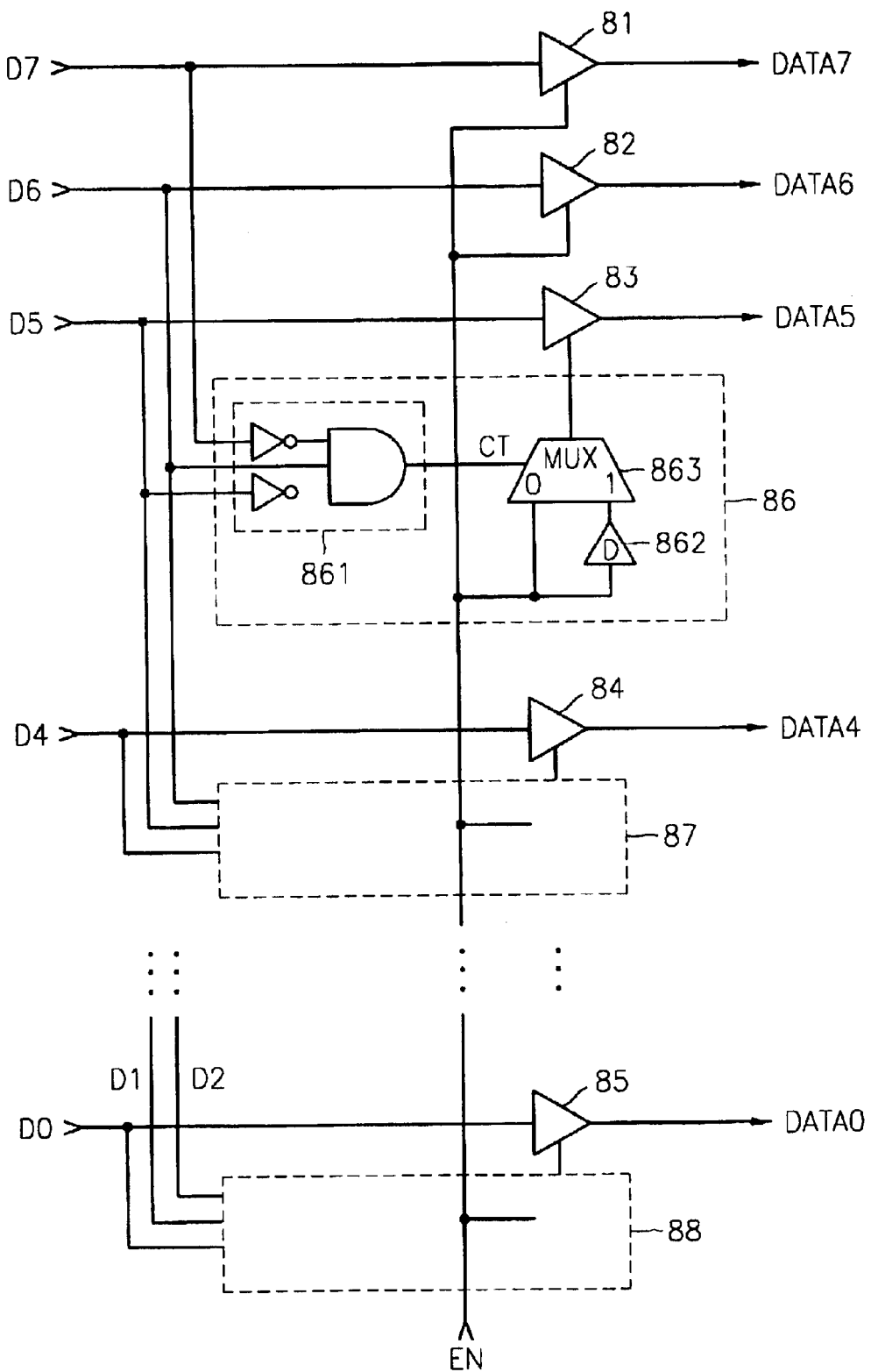
FIG. 8 is a circuit diagram showing a bus driving circuit according to another embodiment of the present invention.

FIG. 7 is a timing diagram showing a bus driving method according to another embodiment of the present invention. FIG. 8 is a circuit diagram showing a bus driving circuit according to another embodiment of the present invention, which is preferably used for implementing the method of FIG. 7. For illustrative purposes, a method and circuit according to this embodiment will be explained with reference to an 8-bit data bus, although it is to be understood that the invention may be used with other size data busses or address busses.

The timing diagram of FIG. 7 illustrates a bus driving method according to an embodiment of the invention wherein it is determined whether or not data bits to be loaded on three sequentially neighboring data buses are [0, 1, 0]), and if the data bits are not [0, 1, 0], the three buses are simultaneously driven without delay. On the other hand, if the data bits on three neighboring buses are [0, 1, 0], the most significant bits of the group are driven on the corresponding data bus line without delay and the least significant bit of the group is driven on the corresponding data bus line after a predetermined delay time (TD) or after the transition slope (dotted lines) of the data bus is lowered.

For example, assume a byte of data to be loaded on data buses (DATA[7:0]) is '01000101', three neighboring data buses (DATA[7, 6, 5]) and three neighboring data buses (DATA[3, 2, 1]) are loaded with data [0, 1, 0]. Accordingly, data buses (DATA[7, 6, 4, 3, 2, 0]) are driven first, and then data buses (DATA[5, 1]) are driven with a time difference, that is, after a predetermined delay time (TD), or after the transition slopes of the data buses (DATA[5, 1]) are lowered. In this example, victim DATA5 does not overlap aggressor DATA6, and victim DATA1 does not overlap the transition of aggressor DATA2. Accordingly, the effect of coupling decreases.

FIG. 8 illustrates a bus driving circuit according to an embodiment of the invention which is preferably used for implementing the method described above with reference to FIG. 7. The bus driving circuit comprises a plurality of drivers 81-84 . . . 85 and a plurality of control circuits 86, 87 . . . 88.

Each control circuit determines whether or not the data bits loaded on three sequentially neighboring data buses are [0, 1, 0]. For a given control circuit, if it is determined that the data bits are not [0, 1, 0], the control circuit will output an enable signal (EN) without delay, and if it is determined that the data is bits are [0, 1, 0], the control circuit will delay an enable signal (EN) for a predetermined time (TD) and then output the enable signal (EN).

More specifically, each control circuit comprises a logic circuit 861, a delay 862, and a selector 863. If the data bits loaded on the three sequentially neighboring data buses, for example, data ([D7, D6, D5]), are not [0, 1, 0], the logic circuit 861 deactivates a control signal (CT) to logic "0", and if data ([D7, D6, D5]) are [0, 1, 0], the logic circuit 861 activates the control signal (CT) to logic "1". The delay 862 delays an enable signal (EN) for a predetermined time (TD). The selector 863 preferably comprises a multiplexer. If the control signal (CT) is not activated, the selector 863 selects and outputs an enable signal (EN), and if the control signal (CT) is activated, the selector 863 selects and outputs the output signal of the delay 862.

The first two drivers 81 and 82 receive data (D7, D6) in response to an enable signal (EN), and drive respective data buses (DATA7, DATA6). Drivers 83, 84 . . . 85 receive respective data (D5–D0) in response to the output signal of the control circuits 86, 87 . . . 88, and drive respective data buses (DATA5–DATA0).

For example, if data ([D7, D6, D5]) are not [0, 1, 0], the control signal (CT) is deactivated to logic "0", the selector 863 selects and outputs an enable signal (EN), and in response to the enable signal (EN) the driver 83 drives data bus (DATA5). If data ([D7, D6, D5]) are [0, 1, 0], the control signal (CT) is activated to logic "1", the selector 863 selects and outputs the output signal of the delay 862, and in response to the output signal of the delay 862, that is, the enable signal which is delayed for a predetermined time (TD), the driver 83 drives data bus (DATA5).

As described above, bus driving methods and circuits according to the present invention decrease interference such as coupling effects between buses. Therefore, in a semiconductor IC employing a bus driving circuit according to an embodiment of the present invention, the intervals between buses may advantageously be reduced more, which accordingly reduces the chip area of the semiconductor IC.

Although illustrative embodiments have been described herein with reference to the accompanying drawings, it is to be understood that the invention is not limited to the precise system and method embodiments described herein, and that various other changes and modifications may be affected therein by one skilled in the art without departing form the scope or spirit of the invention. All such changes and modifications are intended to be included within the scope of the invention as defined by the appended claims.

What is claimed is:

1. A method for driving a bus comprising a plurality of bus lines, the method comprising the steps of:
    driving at a first time, each bus line that is to transmit a data bit having a first logic value; and
    driving at a second time which is subsequent to the first time, each bus line that is to transmit a data bit having a second logic value.

2. The method of claim 1, wherein the second time is (i) a predetermined delay time or (ii) a time after the transition slopes of the buses, which are driven at the second time, are lowered.

3. The method of claim 1, wherein the bus comprises data bus or an address bus.

4. The method of claim 1, wherein the first logic value is a logic "low" level, and the second logic value is a logic "high" level.

5. The method of claim 1, wherein the first logic value is a logic "high" level, and the second logic value is a logic "low" level.

6. A method for driving a bus comprising a plurality of bus lines, the method comprising the steps of:
    determining whether a group of data bits loaded on three sequentially adjacent bus lines are [0, 1, 0];
    if the data bits are not [0, 1, 0], driving the three sequentially adjacent bus lines simultaneously without delay; and
    if the data bits are [0, 1, 0], driving the bus lines corresponding to the two most significant bits of the group of data bits at a first time, and driving the bus line corresponding to the least significant data bit of the group of data bits at a second time which is subsequent to the first time.

7. The method of claim 6, wherein the second time is (i) a predetermined delay time or (ii) a time after the transition slope of the bus corresponding to the least significant bit is lowered.

8. The method of claim 6, wherein the bus comprises a data bus or an address bus.

9. A circuit for driving a bus comprising a plurality of bus lines, the circuit comprising:
    a plurality of control circuits, wherein each control circuit is associated with a bus line and wherein each control circuit outputs a control signal comprising one of a driver enable signal and a delayed driver enable signal, based on a logic level of a data bit to be loaded on an associated bus line; and
    a plurality of drivers, wherein each driver is associated with a bus line and corresponding control circuit, and wherein each driver is responsive to the control signal output from a corresponding control circuit to drive an associated bus line.

10. The circuit of claim 9, wherein each control circuit comprises:
    a delay element which delays the driver enable signal for a predetermined time; and
    a selector that (i) selects and outputs the driver enable signal, if a data bit to be loaded on the associated bus line has a first logic value and that (ii) selects and outputs the delayed driver enable signal, if a data bit to be loaded on the associated bus line has a second logic value.

11. The circuit of claim 9, wherein the bus comprises a data bus or an address bus.

12. The circuit of claim 10, wherein the first logic value is a logic "low" level, and the second logic value is a logic "high" level.

13. The circuit of claim 10, wherein the first logic value is a logic "high" level, and the second logic value is a logic "low" level.

14. A circuit for driving a bus comprising a plurality of bus lines, the circuit comprising:
    a plurality of control circuits, wherein each control circuit outputs a driver enable signal without delay, if data bits loaded on three sequentially adjacent bus lines are not [0, 1, 0], and wherein each control circuit delays the driver enable signal for a predetermined time and then outputs a delayed driver enable signal, if the data bits loaded on the three sequentially adjacent bus lines are [0, 1, 0]; and
    a plurality of drivers which drive corresponding bus lines in response to the output signals from the control circuits.

15. The circuit of claim 14, wherein each control circuit comprises:
    a logic circuit that deactivates a control signal if the data bits are not [0, 1, 0], and activates the control signal if the data bits are [0, 1, 0];
    a delay element which delays the driver enable signal for the predetermined time; and
    a selector that selects and outputs the driver enable signal if the control signal is not activated, and selects and outputs the delayed driver enable signal if the control signal is activated.

16. The circuit of claim 14, wherein the bus comprises a data bus or an address bus.

* * * * *